(12) United States Patent
Holdsclaw

(10) Patent No.: US 8,589,099 B2
(45) Date of Patent: Nov. 19, 2013

(54) DETERMINING COMPONENTS OF AN ELECTRIC SERVICE USING TOLERANCE RANGES

(75) Inventor: Scott T. Holdsclaw, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 349 days.

(21) Appl. No.: 12/900,673

(22) Filed: Oct. 8, 2010

(65) Prior Publication Data
US 2012/0089354 A1 Apr. 12, 2012

(51) Int. Cl.
G01R 19/00 (2006.01)
(52) U.S. Cl.
USPC .......................................................... 702/64
(58) Field of Classification Search
USPC ................................ 702/64–66, 182–185, 188
See application file for complete search history.

(56) References Cited

U.S. PATENT DOCUMENTS

| | | | |
|---|---|---|---|
| 5,544,089 A | 8/1996 | Hemminger et al. | |
| 5,631,554 A | 5/1997 | Briese et al. | |
| 6,094,622 A | 7/2000 | Hubbard et al. | |
| 6,112,158 A | 8/2000 | Bond et al. | |
| 6,236,197 B1 | 5/2001 | Holdsclaw et al. | |
| 6,374,188 B1 | 4/2002 | Hubbard et al. | |
| 6,629,046 B1 * | 9/2003 | Bond et al. | 702/61 |
| 7,756,651 B2 | 7/2010 | Holdsclaw | |
| 8,085,009 B2 | 12/2011 | Lumsden | |
| 2012/0089354 A1 | 4/2012 | Holdsclaw | |

OTHER PUBLICATIONS

U.S. Appl No. 12/900,651, filed Oct. 8, 2010, Holdsclaw.

* cited by examiner

Primary Examiner — Edward Raymond
(74) Attorney, Agent, or Firm — Woodcock Washburn LLP

(57) ABSTRACT

Components of an electric service may be identified by measuring voltage signals relating to the connection of an electrical energy meter connected to the electric service. The voltage signals that may be measured include line to neutral voltages and line to line voltages. The values of the measured line to neutral voltages may be compared to reference information comprising tabulated values that may be tabulated as ratios of nominal service voltages associated with different service types. The values of the measured line to line voltages may be compared to ideal line to line voltages calculated using fixed values from the reference information.

22 Claims, 6 Drawing Sheets

Figure 3

| | Service Type | Special Service Definition | Nom Svc Voltage | Van | Vbn | Vcn | Cos VaVb | Cos VbVc | Cos VcVa |
|---|---|---|---|---|---|---|---|---|---|
| 291 | 4WY | | 69.3 | 100% | 100% | 100% | -0.5 | -0.5 | -0.5 |
| 292 | 4WD | Hi Leg C | 120.0 | 50.0% | 50.0% | 86.5% | -1.0 | 0 | 0 |

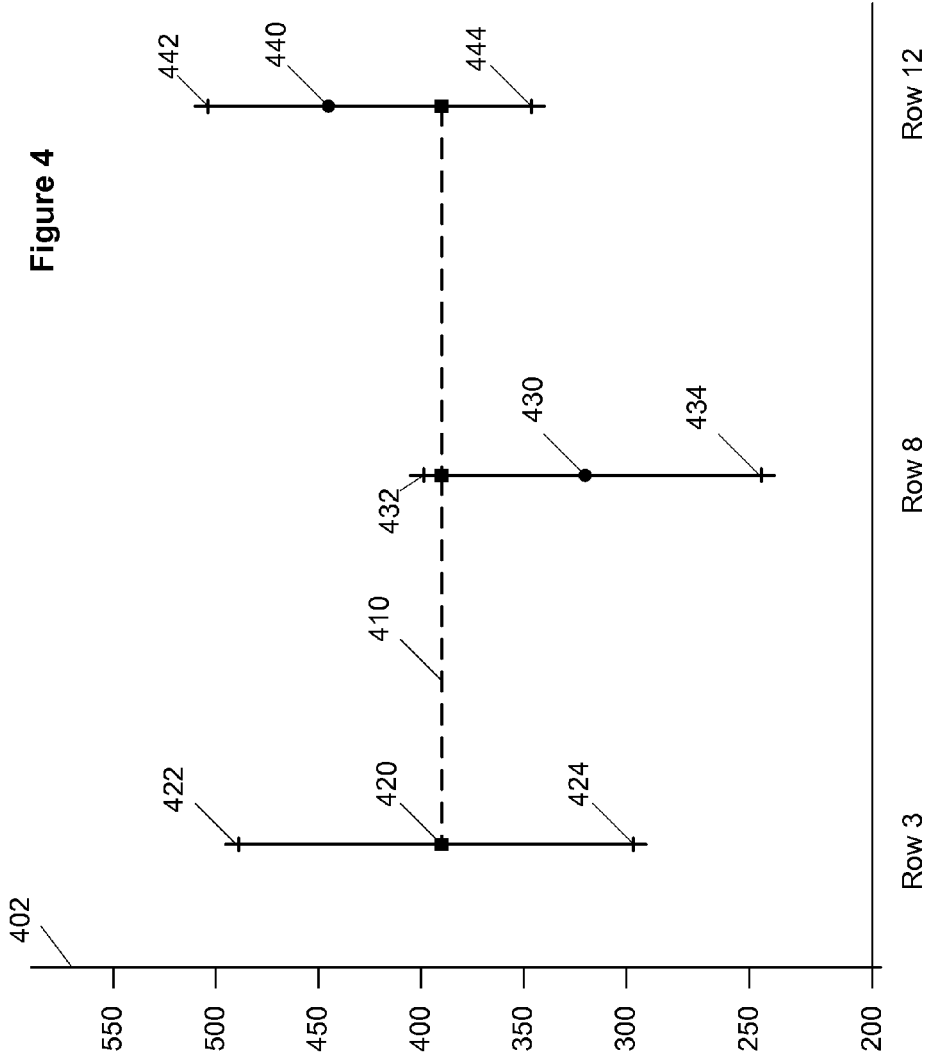

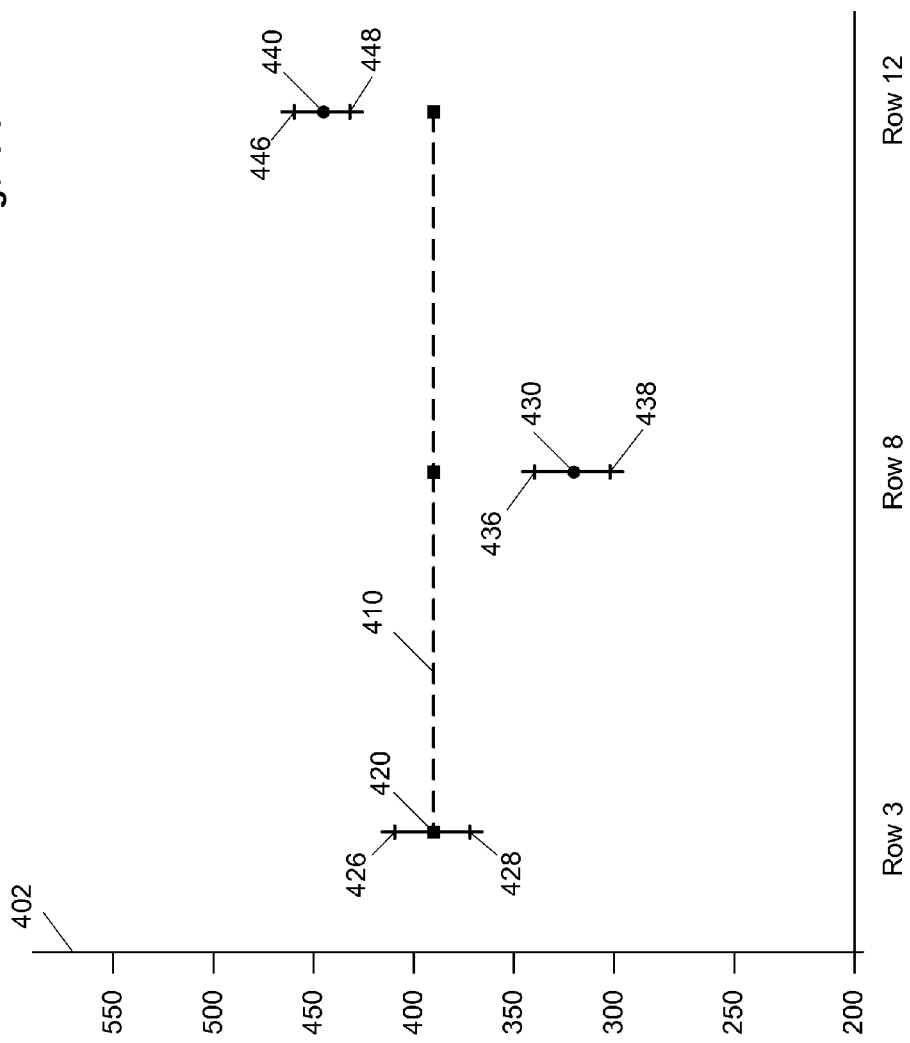

DETERMINING COMPONENTS OF AN ELECTRIC SERVICE USING TOLERANCE RANGES

CROSS-REFERENCE

This application is related by subject matter to U.S. patent application Ser. No. 12/900,651, filed on Oct. 8, 2010, and entitled "DETERMINING COMPONENTS OF AN ELECTRIC SERVICE," the content of which is incorporated by reference in its entirety.

BACKGROUND

Electrical energy meters now perform tasks in addition to simple energy metering. One of the additional tasks is to verify or detect an electric service or a component of the electric service, such as a service type, a nominal service voltage and/or a phase rotation. Currently, electric service detection is typically performed, in part, by calculating one or more phase angles between applied phasor voltages.

The current systems and methods used for service detection may require complex calculations. For example, the calculations typically require using a Discrete Fourier Transform (DFT) type of calculation, where the signal in question is multiplied by a reference signal, and then multiplied by the reference signal delayed by 90 degrees. The reference signal may be an actual line to neutral voltage itself, and/or in other cases may be an ideal signal based on the reference signal. In either case, two resultant values are calculated and from those two values, an angle or angles may be calculated. The current systems and methods may also expend significant software, hardware and/or time resources to perform the calculations associated with determining the phase angle, and further, to determine service components from the applied voltage phasors and phase angles. Examples of current systems and methods to determine an electric service may be found in U.S. Pat. No. 6,094,622 entitled SYSTEM AND METHOD FOR AUTOMATICALLY DETERMINING THE ELECTRICAL ENERGY SERVICE TYPE TO WHICH AN ENERGY METER IS CONNECTED, U.S. Pat. No. 6,112,158 entitled SERVICE TYPE RECOGNITION IN ELECTRICAL UTILITY METER and U.S. Pat. No. 5,631,554 entitled ELECTRONIC METERING DEVICE INCLUDING AUTOMATIC SERVICE SENSING.

It would be desirable to be able to identify alternate ways to determine an electric service, or a component of the electric service, associated with an electrical energy meter connection without directly calculating a phase angle.

SUMMARY

In an electrical system, an electrical energy meter may determine one or more components of an electric service relating to a connection of the electrical energy meter. Components of the electric service may include a service type (which may include a special service definition) and nominal service voltage.

Voltage signals relating to the connection of the electrical energy meter may be measured. The voltage signals that may be measured include line to neutral voltages and line to line voltages. The measurements may be taken as RMS values. Values of the measured line to neutral voltage signals may be compared to reference information. In addition, values of measured line to line voltage signals may be compared to calculated ideal line to line voltages. The reference information may comprise service records associated with different service types. The service records may include tabulated values. A tabulated value may be tabulated as a ratio, which may represent a voltage value as a ratio of a nominal service voltage associated with a service type. The service records may also include fixed values associated with different service types that may be used in calculating ideal line to line voltages. The comparisons may be made in order to determine a service type and/or nominal service voltage associated with the connection of the electrical energy meter by matching the measured line to neutral values with tabulated values and by matching measured line to line values with fixed values used to calculate ideal line to line values.

A first tolerance range may be used when comparing a measured line to neutral voltage value to a tabulated value. If the measured line to neutral voltage value is within the first tolerance range of the tabulated value, the measured line to neutral voltage may be deemed to satisfy the tabulated value. A second tolerance range may be used when comparing a measured line to line voltage value to a calculated ideal line to line voltage value. The second tolerance range may be smaller than the first tolerance range. If the measured line to line voltage value is within the second tolerance range of the calculated ideal line to line voltage value, the measured line to line voltage may be deemed to satisfy the calculated ideal line to line voltage value, and, therefore, may be deemed to satisfy the table entry corresponding to the fixed value used to calculate the ideal line to line voltage value. If the measured line to neutral and line to line voltages match tabulated values and fixed values associated with a service record, a service type and nominal service voltage associated with the service record may be identified as the service type and nominal service voltage associated with the connection of the electrical energy meter.

BRIEF DESCRIPTION OF THE DRAWINGS

FIG. 3 is a diagram illustrating a partial service record table for a 3-Element electrical energy meter.

FIG. 4 illustrates the use of a tolerance range associated with exemplary calculated ideal line to line voltages.

FIG. 5 illustrates the use of a tolerance range associated with the exemplary calculated ideal line to line voltages of FIG. 4, where the tolerance range used is smaller than that used in the example of FIG. 4.

DETAILED DESCRIPTION

Most electrical energy meters digitally sample voltage and current signals on one to three different phases, and process them to typically generate quantities for billing purposes. Electrical energy meters typically measure basic power quantities like watthours, VARhours or VAhours. The electronic electrical energy meters also have become capable of conducting a variety of instrumentation and/or power line performance determinations.

Systems and methods describing the novel techniques will now be described with reference to the figures. It will be appreciated by those of ordinary skill in the art that the description given herein with respect to those figures is for exemplary purposes only and is not intended in any way to limit the scope of the invention. For example, although an example electrical energy meter may be used to illustrate the invention, it should be appreciated that this electrical energy meter is merely provided for the purpose of clearly describing the methods and systems. However, this discussion is not intended to limit the disclosed embodiments. In fact, the disclosed techniques are equally applicable to other meters and metering systems.

Figure 1:
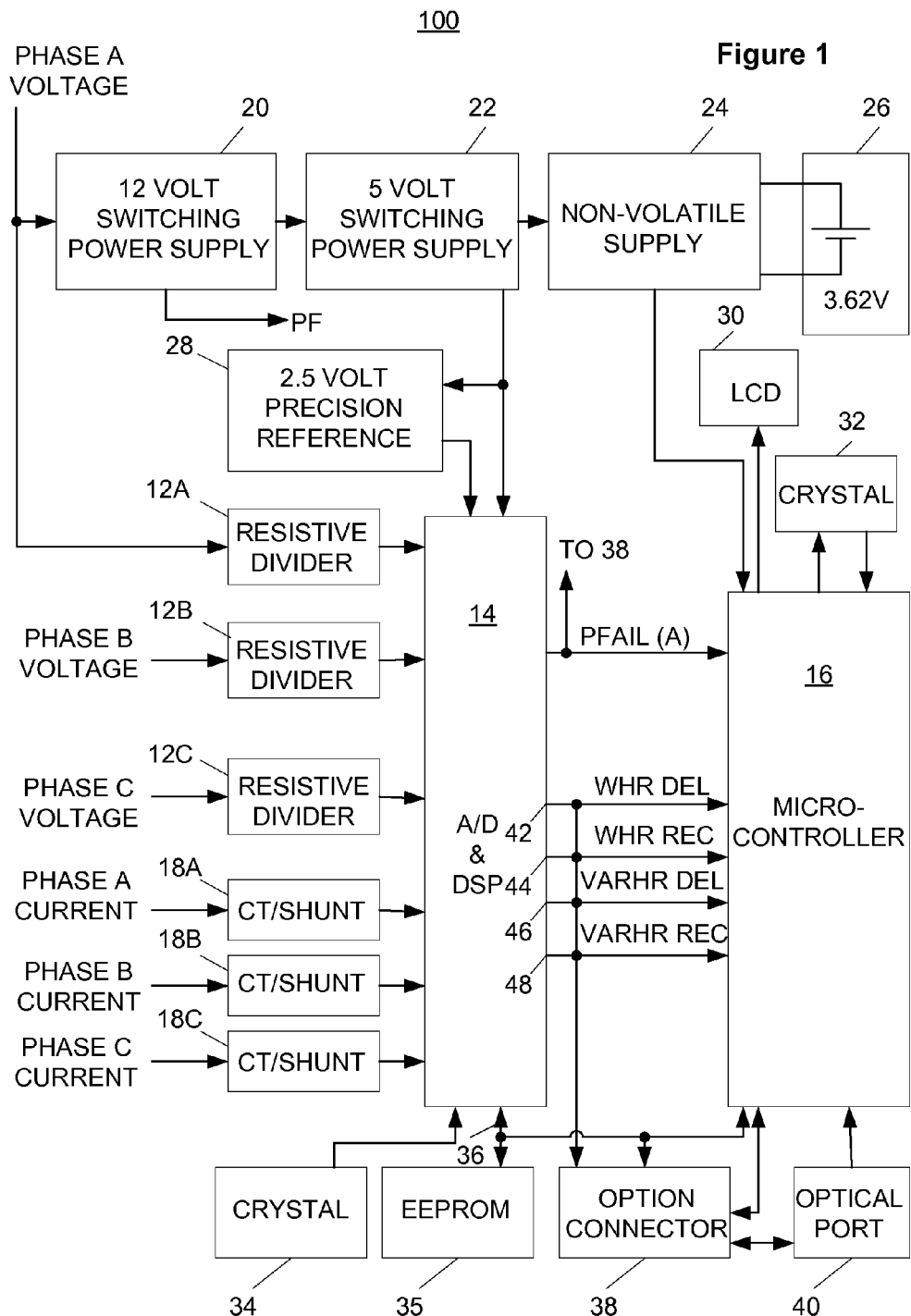
FIG. 1 is a block diagram of a programmable electrical energy meter for measuring electrical parameters.

FIG. 1 is a block diagram showing the functional components of an example electrical energy meter and related interfaces to which the present invention is applicable. As shown in FIG. 1, a electrical energy meter 100 for metering three-phase electrical energy preferably includes a digital LCD type display 30, crystal oscillators 32 and 34, a meter integrated circuit (IC) 14 which preferably comprises A/D converters and a programmable digital signal processor (DSP), and a microcontroller 16. The meter also includes a 12 V switching power supply 20 that is capable of receiving alternating current voltage, a 5 Volts switching power supply 22, a non-volatile power supply 24 that switches to a battery 26 when 5 Volts supply is inoperative, and a 2.5 Volt precision voltage reference 28. Analog voltage and current signals propagating over power distribution lines between the power generator of the electric service provider and the users of the electrical energy are sensed by voltage dividers 12A, 12B, 12C and current transformers or shunts 18A, 18B, 18C, respectively.

The outputs of the resistive dividers 12A-12C and current transformers 18A-18C, or sensed voltage and current signals, are provided as inputs to the meter IC 14. The A/D converters in the meter IC 14 convert the sensed voltage and current signals into digital representations of the analog voltage and current signals. In a preferred embodiment, the A/D conversion is carried out as described in U.S. Pat. No. 5,544,089, dated Aug. 6, 1996, and entitled PROGRAMMABLE ELECTRICAL METER USING MULTIPLEXED ANALOG-TO-DIGITAL CONVERTERS, which is herein incorporated by reference. The digital voltage and current signals are then input to the programmable DSP in the meter IC 14 for generating pulsed signals 42, 44, 46, 48 representing various power measurements, i.e., each pulse represents the Ke value associated with Watts, VAs, or VARs. These pulsed signals may be processed by the microcontroller 16 to perform revenue metering functions for billing purposes.

The microcontroller 16 preferably interfaces with the meter IC 14 and with one or more memory devices through an IIC bus 36. A memory, preferably a non-volatile memory such as an EEPROM 35, is provided to store nominal phase voltage and current data and threshold data as well as programs and program data. Upon power up after installation, a power failure, or a data altering communication, for example, selected data stored in the EEPROM 35 may be downloaded to the program RAM and data RAM associated within the meter IC 14, as shown in FIG. 1. The DSP under the control of the microcontroller 16 processes the digital voltage and current signals in accordance with the downloaded programs and data stored in the respective program RAM and data RAM.

To perform line frequency measurements and compensation, the meter IC 14 monitors the line frequency over, for example, multiple line cycles. It should be understood that the number of line cycles is preferably programmable and a different number of line cycles may be used for designated measurements. In fact, using the disclosed techniques it may be possible to perform power line measurements and analysis using less than one full line cycle.

Following power-up at installation, a service test may be performed to identify and/or check the electric service. The electrical energy meter may be preprogrammed for use with a designated electric service or it may determine the electric service, or components thereof, using a service test (e.g., using the methods described herein). When the service test is used to identify the electric service, an initial determination is made of the number of active elements. To this end, each element (i.e., 1, 2, or 3 elements) may be checked for voltage. Once the number of elements is identified, many of the service types can be eliminated from the list of possible service types. One or more components of the electric service, such as phase rotation, nominal service voltage, and service type, may be displayed on the LCD display 30. The service may be locked, e.g., the service information is stored in a memory, preferably a non-volatile memory, such as the EEPROM 35, manually or automatically. There are a variety of possible service types including 4-wire wye, 3-wire wye, 4-wire delta, 3-wire delta, or single phase, just to name a few.

When the service type is known in advance and locked, the service test may check to ensure that each element is receiving line potential, and the line to neutral and line to line voltages are within a predetermined percentage of the nominal service voltage. The line to neutral voltages may also be sampled to determine polarity of a voltage. If the voltages are within the specified ranges, the nominal service voltage, the service type and the phase rotation may be displayed on the electrical energy meter display. If either a valid service is not found or the service test for a designated service fails, a system error code indicating an invalid service may be displayed and locked on the display to ensure that the failure is noted and evaluated to correct the error.

It should also be appreciated that electrical energy meter 100 also provides for remote meter reading, remote power quality monitoring, and reprogramming through an optical port 40 and/or an option connector 38. Although optical communications may be used in connection with the optical port 40, option connector 38 may be adapted for RF communications or electronic communications via modem, for example.

The disclosed techniques may be in firmware, wherein such operations are enabled by the correct programming of data tables. However, it should also be appreciated that the disclosed techniques also may be using software and/or hardware, or in a combination of the two. In fact, the disclosed techniques are not limited to any particular implementation but contemplate implementation in any tangible form.

There are a variety of different electrical energy meter types that are used to meter electrical energy, including 3-Element, 2-Element, 2½-Element, and 1-Element meters. Moreover, there are a variety of different electrical service types on which electrical energy meters may be installed, including 3-phase 4-wire Wye, 3-phase 4-wire Delta, 3-phase 3-wire Delta, network, dual single phase, 2-wire and 3-wire single phase, and "single phase test."

There are a variety of different electrical energy meter types that are used to meter electrical energy, including 3-Element, 2-Element, 2½-Element, and 1-Element meters. Moreover, there are a variety of different electric service types on which electrical energy meters may be installed, including 3-phase 4-wire Wye, 3-phase 4-wire Delta, 3-phase 3-wire Delta, network, dual single phase, 2-wire and 3-wire single phase, and "single phase test."

Each of the various different electrical energy meter types may be capable of metering more than one of the various different service types. For example, a 3-Phase 4-Wire Wye ("4WY") service may include three voltages with respect to neutral and three line currents, one current for each voltage phase. When metering the 4WY service using a 3-Element electrical energy meter, each line current may be multiplied by its associated line to neutral voltage. Metering the 4WY service with a 2½-Element electrical energy meter may use two voltages, e.g., Phase A to neutral and Phase C to neutral, and 3 line currents. Line currents for Phase A and Phase C may be multiplied by their respective line to neutral voltages, and the Phase B current may be multiplied by the negated sum of the Phase A and Phase C voltages (which may approximate the Phase B line to neutral voltage in a balanced system). Metering the 4WY service with a 2-Element meter may use external current transformers to combine the currents such that the Phase A line to neutral voltage is multiplied by a current representing the Phase A line current minus the Phase B line current. Phase C line to neutral voltage may be multiplied by a current representing the Phase C line current minus the Phase B line current.

A 3-Phase 4-Wire Delta ("4WD") service may include three voltages with respect to a ground point that is placed at the center-tapped point between two of the three voltages (e.g., typically between Phases A and B). Metering the 4WD service may use two or three currents depending on the type of electrical energy meter used. When metering the 4WD service with a 3-Element electrical energy meter, each line current may be multiplied by its associated line to ground voltage. Metering the 4WD service with a 2-Element electrical energy meter may use two voltages, e.g., Phase C to ground and the voltage from Phase A to Phase B. The two currents available to the 2-Element electrical energy meter may be the Phase C line current and the Phase A current minus Phase B current. Operation of the 2-Element electrical energy meter may conserve the equipment costs required by an additional voltage transformer and/or an additional current transformer.

As another example, a 3-Phase 3-Wire Delta (3WD) service may include two voltages with respect to a third voltage, generating actual line-to-line voltages, and 2 currents, which may be measured with a 2-Element electrical energy meter. However, a 3-Element meter may also be used, e.g., with neither voltage nor current applied to one of the 3 phases (e.g., Phase B may be left open).

Also, there is a Dual Single Phase (Dual 1P) service. The Dual 1P service may have five voltage points. There may be two 3-wire single phase services 90 degrees apart having their center-taps tied together and grounded. This service typically may be measured by a 2-Element electrical energy meter. However, because the 2-Element electrical energy meter may have four voltage input points, the four voltages may be applied to the electrical energy meter and the common grounded center-tap may not be provided to the electrical energy meter. For the current, two of the currents may be combined for one of the 3-wire services and applied to the appropriate current input. The two other currents for the other 3-wire service may be combined and applied to the other current input on the electrical energy meter.

Single phase electrical energy meters may be associated with 2-wire or S-wire services. A 2-wire single phase service may have a single line to ground voltage and a single line current. A single phase service may be metered with a single phase meter, however a 2-Element or 3-Element meter may be used, e.g., by using one of the available phases (typically Phase A).

A single phase 3-wire service may be a 2-phase service with the two voltages to ground being 180 degrees away from each other. This may represent the typical residential service type. This service may be metered by a single phase meter where two "line voltages" may be supplied to the meter with no ground connection. Both current legs (from the two line voltages) may also be supplied to the meter. The single phase meter may calculate a line to line voltage and multiply that by the average of the current from the two currents that are input. A 2-phase service may be metered with a 2-Element meter in which both line voltages and the ground voltage may be supplied to the meter. Both current legs (from the two line voltages) may be supplied to the meter. In the 2-Element meter each line to ground voltage may be multiplied by its respective current.

The single phase test service (1P Test) may represent a convenience for utilities to recognize a commonly used testing configuration where the same single voltage may be applied to the phases of a meter. This may be done on any of the different meter types.

Figure 2:
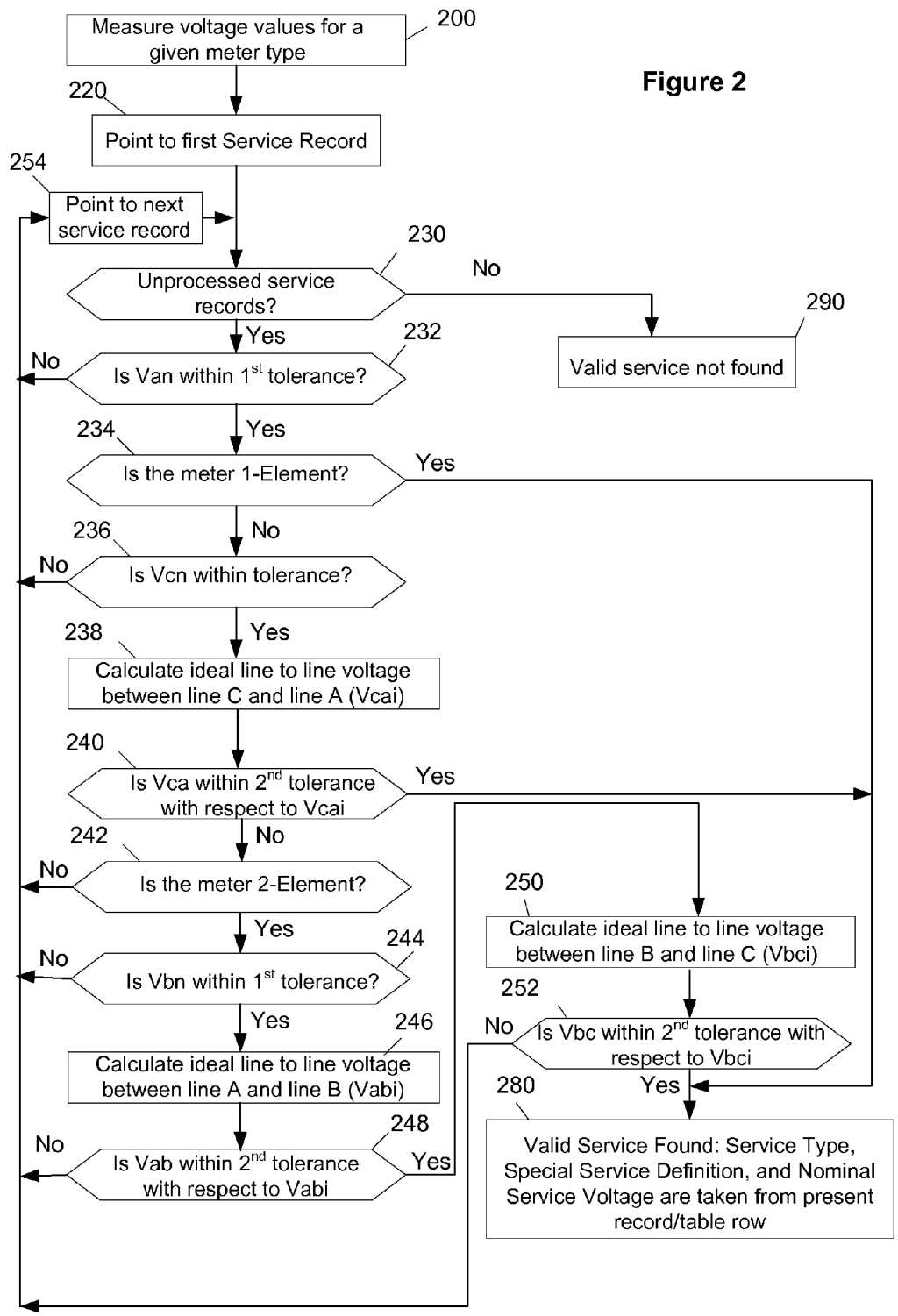
FIG. 2 illustrates an exemplary method to determine components of an electric service, such as a service type and/or a nominal service voltage, relating to a connection of an electrical energy meter.

FIG. 2 illustrates an exemplary method to determine components of an electric service, such as a service type, special service definition, and/or nominal service voltage, relating to a connection of an electrical energy meter. The method illustrated in FIG. 2, as well as other methods herein disclosed, may refer to one or more service record tables that list reference information relating to known services.

An exemplary service record table is shown in FIG. 3 illustrating partial data for a 3-Element electrical energy meter. The reference information of FIG. 3 comprises several columns and rows, including column 274, column 275, column 276, column 277, column 278, column 279, column 280, column 281, and column 282, as well as rows 291 and 292. A row in a service record table, e.g., row 291 or 292 in FIG. 3, may be referred to a service record or record.

Column 274 lists some service types to which an electrical energy meter may be connected. For example, possible service types include a 3-Phase Four Wire Wye ("4WY") service type as illustrated in row 291 and a 3-Phase Four Wire Delta ("4WD") service type, as illustrated in row 292. Column 275 may list some special service definitions. A special service definition may serve to differentiate between entries with the same service type, as illustrated in row 292 where "Hi Leg C" is a special service definition for a 3-Phase Four Wire Delta ("4WD") service type. The term "service type" may refer to the combination of "service type" (column 274) and "special service definition" (column 275). Column 276 lists some nominal service voltages to which an electrical energy meter may be connected. For example, a possible nominal service voltage value for the 3-Phase Four Wire Wye ("4WY") service type as illustrated in row 291 may be 69.3 Volts. As another example, a possible nominal service voltage value for the 3-Phase Four Wire Delta ("4WD") service type as illustrated in row 292 may be 120.0 Volts.

Columns 277-279 list known voltage ratios/values (i.e., the percentage of the nominal service voltage associated with each line to neutral voltage) associated with a given service type and nominal service voltage. Column 277 lists line to neutral voltage ratios/values for a voltage measured from line A to neutral, Van, relating to different service types. Column 278 lists line to neutral voltage ratios/values for a voltage measured from line B to neutral, Vbn, relating to different service types. Column 279 lists line to neutral voltage ratios/ values for a voltage measured from line C to neutral, Vcn, relating to different service types.

The line to neutral voltages are listed as ratios/values of a related nominal service voltage. That is, each service type may indicate a relationship between each of these voltages and a nominal service voltage. Thus, a listed ratio (i.e., percentage) indicates an expected voltage value for its related line to neutral voltage. For example, for the 3-Phase Four Wire Wye ("4WY") service type listed in row 291, the line to neutral voltages Van, Vbn and Vcn may be 100.0% of the nominal service voltage of 69.3 Volts. That is, for a 4WY service type and a nominal service voltage of 69.3 Volts, the expected line to neutral voltages are:

Van=69.3 Volts
Vbn=69.3 Volts; and
Vcn=69.3 Volts

Columns 280-282 list fixed values associated with different service types. The fixed values may be used to calculate ideal line to line voltages, which is discussed further in relation to FIG. 2.

Column 280 lists fixed values used to calculate an ideal line to line voltage from line A to line B, Vabi, relating to different service types. Column 281 lists fixed values used to calculate an ideal line to line voltage from line B to line C, Vbci, relating to different service types. Column 282 lists fixed values used to calculate an ideal line to line voltage from line C to line A, Vcai, relating to different service types.

Tables 1, 2, 3, and 4 illustrate more detailed reference information for several different meter types and services. Table 1 illustrates service records for a 3-Element electrical energy meter for known service types and nominal service voltages. Table 2 illustrates service records for a 2½-Element electrical energy meter for known service types and nominal service voltages. Table 3 illustrates service records for a 2-Element electrical energy meter for known service types and nominal service voltages. Table 4 illustrates service records for a 1-Element electrical energy meter for known service types and nominal service voltages. The voltage values in the tables (e.g., the nominal service voltages and line to neutral voltages) may be given as root mean square (RMS) values. Service types may be associated with different nominal service voltages. For example in Table 1, the nominal service voltage values for a 3-Element Four Wire Wye ("4WY") service type are 69.3, 120 or 277 Volts, and for a 3-Element Four Wire Delta ("4WD") service type are 120, 240 or 480 Volts.

TABLE 1

Exemplary Service Record Table for a 3-Element Meter

| Service Type | Special Service Definition | Nom Svc Voltage | $V_{an}$ | $V_{bn}$ | $V_{cn}$ | Fixed Value to calculate $V_{abi}$ | Fixed Value to calculate $V_{bci}$ | Fixed Value to calculate $V_{cai}$ |
|---|---|---|---|---|---|---|---|---|
| 4WY |  | 69.3 | 100.0% | 100.0% | 100.0% | −0.5 | −0.5 | −0.5 |
| 4WY |  | 120 | 100.0% | 100.0% | 100.0% | −0.5 | −0.5 | −0.5 |
| 4WY |  | 277 | 100.0% | 100.0% | 100.0% | −0.5 | −0.5 | −0.5 |
| 4WD | Hi Leg C | 120 | 50% | 50% | 86.6% | −1.0 | 0 | 0 |
| 4WD | Hi Leg C | 240 | 50% | 50% | 86.6% | −1.0 | 0 | 0 |
| 4WD | Hi Leg C | 480 | 50% | 50% | 86.6% | −1.0 | 0 | 0 |
| 4WD | Hi Leg B | 120 | 50% | 86.6% | 50% | 0 | 0 | −1.0 |
| 4WD | Hi Leg B | 240 | 50% | 86.6% | 50% | 0 | 0 | −1.0 |
| 4WD | Hi Leg B | 480 | 50% | 86.6% | 50% | 0 | 0 | −1.0 |
| 4WD | Hi Leg A | 120 | 86.6% | 50% | 50% | 0 | −1.0 | 0 |
| 4WD | Hi Leg A | 240 | 86.6% | 50% | 50% | 0 | −1.0 | 0 |
| 4WD | Hi Leg A | 480 | 86.6% | 50% | 50% | 0 | −1.0 | 0 |
| 1P_Test |  | 69.3 | 100% | 100% | 100% | 1.0 | 1.0 | 1.0 |
| 1P_Test |  | 120 | 100% | 100% | 100% | 1.0 | 1.0 | 1.0 |
| 1P_Test |  | 240 | 100% | 100% | 100% | 1.0 | 1.0 | 1.0 |
| 1P_Test |  | 277 | 100% | 100% | 100% | 1.0 | 1.0 | 1.0 |
| 1P_Test |  | 480 | 100% | 100% | 100% | 1.0 | 1.0 | 1.0 |

TABLE 2

Exemplary Service Record Table for 2½-Element Meter

| Service Type | Special Service Definition | Nom Svc Voltage | $V_{an}$ | $V_{bn}$ | $V_{cn}$ | Fixed Value to calculate $V_{abi}$ | Fixed Value to calculate $V_{bci}$ | Fixed Value to calculate $V_{cai}$ |
|---|---|---|---|---|---|---|---|---|
| 4WY |  | 69.3 | 100.0% | 100.0% | 100.0% | −0.5 | −0.5 | −0.5 |
| 4WY |  | 120 | 100.0% | 100.0% | 100.0% | −0.5 | −0.5 | −0.5 |
| 4WY |  | 277 | 100.0% | 100.0% | 100.0% | −0.5 | −0.5 | −0.5 |
| 1P_test |  | 69.3 | 100.0% | 200.0% | 100.0% | −1.0 | −1.0 | 1.0 |
| 1P_test |  | 120 | 100.0% | 200.0% | 100.0% | −1.0 | −1.0 | 1.0 |
| 1P_test |  | 277 | 100.0% | 200.0% | 100.0% | −1.0 | −1.0 | 1.0 |

TABLE 3

Exemplary Service Record Table for 2-Element Meter

| Service Type | Special Service Definition | Nom Svc Voltage | $V_{an}$ | $V_{bn}$ | $V_{cn}$ | Fixed Value to calculate $V_{abi}$ | Fixed Value to calculate $V_{bci}$ | Fixed Value to calculate $V_{cai}$ |
|---|---|---|---|---|---|---|---|---|
| 3WY | | 69.3 | 100.0% | | 100.0% | | | −0.5 |
| 3WY | | 120 | 100.0% | | 100.0% | | | −0.5 |
| 3WY | | 277 | 100.0% | | 100.0% | | | −0.5 |
| 3WD | | 120 | 100.0% | | 100.0% | | | 0.5 |
| 3WD | | 240 | 100.0% | | 100.0% | | | 0.5 |
| 3WD | | 480 | 100.0% | | 100.0% | | | 0.5 |
| 4WD | Hi Leg C | 120 | 100.0% | | 86.6% | | | 0 |
| 4WD | Hi Leg C | 240 | 100.0% | | 86.6% | | | 0 |
| 4WD | Hi Leg C | 480 | 100.0% | | 86.6% | | | 0 |
| 3W 1P | | 120 | 50.0% | | 50.0% | | | −1.0 |
| 3W 1P | | 240 | 50.0% | | 50.0% | | | −1.0 |
| 3W 1P | | 480 | 50.0% | | 50.0% | | | −1.0 |
| 1P_test | | 69.3 | 100.0% | | 100.0% | | | 1.0 |
| 1P_test | | 120 | 100.0% | | 100.0% | | | 1.0 |
| 1P_test | | 240 | 100.0% | | 100.0% | | | 1.0 |
| 1P_test | | 277 | 100.0% | | 100.0% | | | 1.0 |
| 1P_test | | 480 | 100.0% | | 100.0% | | | 1.0 |

TABLE 4

Exemplary Service Record Table for 1-Element Meter

| Service Type | Special Service Definition | Nom Svc Voltage | $V_{an}$ | $V_{bn}$ | $V_{cn}$ | Fixed Value to calculate $V_{abi}$ | Fixed Value to calculate $V_{bci}$ | Fixed Value to calculate $V_{cai}$ |
|---|---|---|---|---|---|---|---|---|
| 1P_test | | 69.3 | 100.0% | | | | | |
| 1P_test | | 100 | 100.0% | | | | | |
| 1P_test | | 240 | 100.0% | | | | | |
| 1P_test | | 277 | 100.0% | | | | | |
| 1P_test | | 480 | 100.0% | | | | | |

Referring back to FIG. 2, at 200, measurements may be taken. For example, voltage measurements, such as those listed in Tables 1-4 may be taken. As described in detail below, the measurements may be saved and compared to tabulated values, such as those in Tables 1-4, in order to determine one or more electric service components Measurements may be made contemporaneously with the comparisons illustrated within FIG. 2, which may be an alternative, or in addition to, the measurements at 200.

Figure 2A:
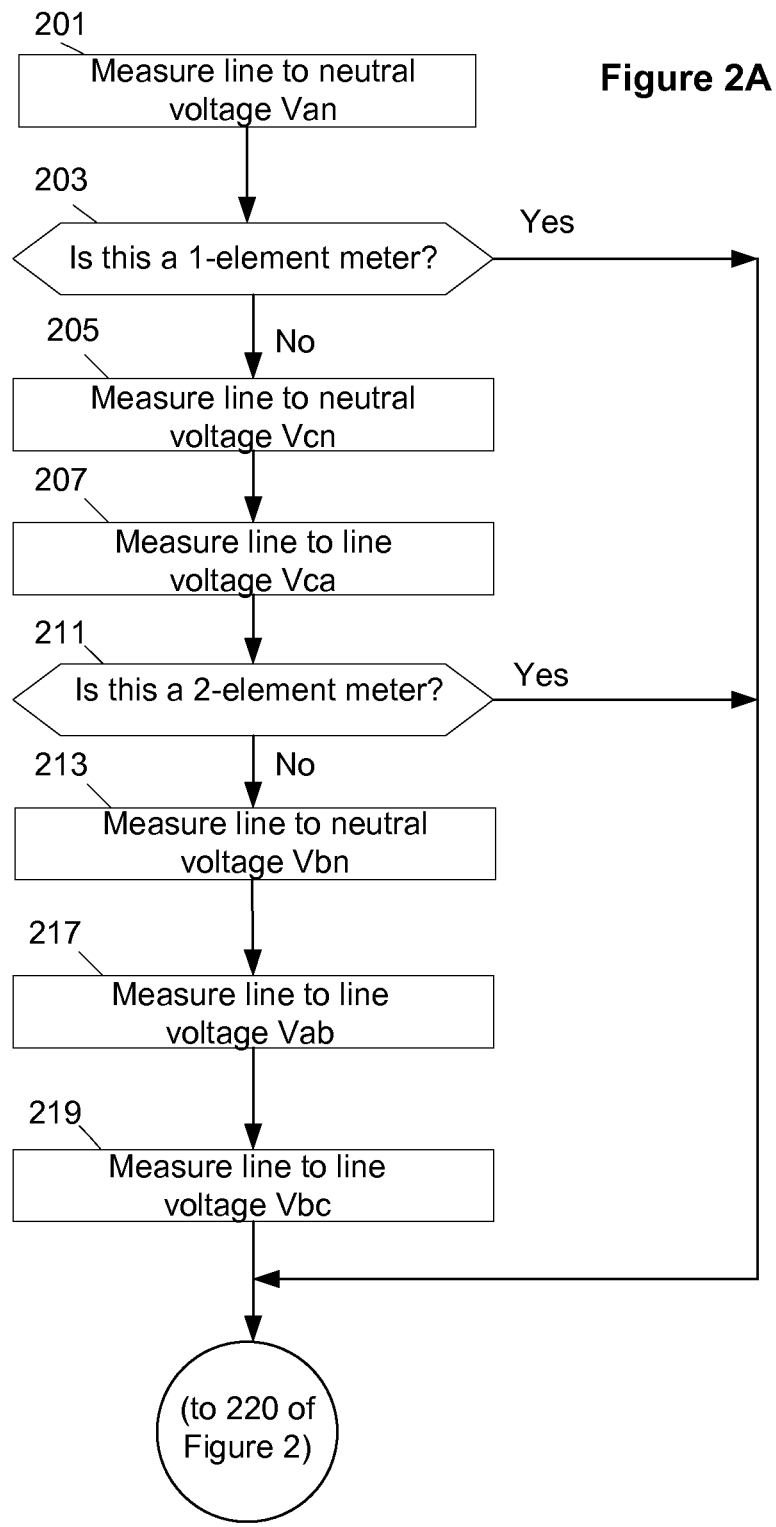
FIG. 2A illustrates exemplary functions relating to voltage measurements.

FIG. 2A illustrates exemplary functions that may be related to the measurements at 200. At 201, line to neutral voltage Van may be measured. At 203, a determination may be made whether the meter is a 1-element meter. If the meter is a 1-element meter, the method may continue at 220 of FIG. 2. If the meter type is not a 1-element meter, line to neutral voltage Vcn may be measured at 205. At 207, the line to line voltage Vca may be measured. At 211, a determination may be made whether the meter is a 2-element meter. If the meter is a 2-element meter, the method may continue at 220 of FIG. 2. If the meter type is not a 2-element meter, at 213, line to neutral voltage Vbn may be measured. At 217 the line to line voltage Vab may be measured and, at 219, line to line voltage Vbc may be measured. The method may continue at 220 of FIG. 2, which may point to a first service record.

At 220, a particular service record may be identified. The particular service record may be used as a starting point for service record comparisons. For example, a first service record of a first service record table may be identified. As a further example, a first service record may be identified with reference to an identified meter type.

At 230, a determination may be made whether there are unprocessed service records (e.g., from one or more service record tables). As an example, if entry to 230 comes from 220 then the service record identified at 220 may be used in subsequent comparisons. If entry to 230 comes from 254, a different service record, if an unprocessed service record is available, may be used, e.g., the subsequent record following the last one used. If an unprocessed service record is unavailable, the process may continue at 290, which may indicate that a valid service was not found.

If, at 230, an unprocessed service record is available, the method may continue at 232. At 232, a determination may be made whether the measured voltage Van (which may be an RMS voltage) is within a first allowable tolerance range (i.e., within an allowable tolerance of the value of Van identified in the current service record). The allowable tolerance range may be a range within which a measured voltage would be deemed to satisfy a table entry (e.g., an entry at a particular column and row of a service record table).

As an illustration, the first allowable tolerance range may be 25% and the measured voltage for Van may be 125 Volts. Using Table 1 as an example, if a measured voltage is within 25% of a ratio/value in the table, the measured voltage may be deemed to satisfy that table entry.

So, in this example, the first allowable tolerance ranges for Van based on the service records of Table 1 may be:

51.98 V<Van<86.63 V (Row 1 and Row 13)
90 V<Van<150 V (Row 2, Row 5, Row 8 and Row 14)
207.75 V<Van<346.25 (Row 3 and Row 16)
45 V<Van<75 V (Row 4 and Row 7)
180 V<Van<300 V (Row 6, Row 9 and Row 15)
77.94 V<Van<129.9 V (Row 10)
155.88 V<Van<259.8 V (Row 11)
311.76 V<Van<519.6 V (Row 12)
360 V<Van<600 V (Row 17)

The measured value of Van, 125 Volts is within the first allowable tolerance range of Van for the table entries for Van corresponding to Rows 2, 5, 8, 10, and 14 of Table 1. As an example, for Row 10, the above first tolerance range was calculated by identifying the anticipated value of Van from Table 1 (120V×86.6%=103.92V) and defining a range 25% above and below the anticipated value (103.92V×75%=77.94V and 103.92V×1.25%=129.9V). The values for Van relating to Rows 2, 5, 8, and 14 are similarly determined. Thus, Van may be deemed to satisfy the value of Van in Rows 2, 5, 8, 10, and 14 of Table 1.

In some embodiments, a similar tolerance may be used for other measured voltages as the tolerance used for Van. However, other embodiments may use different tolerance ranges for other voltages.

When a service record is identified for processing, measured line to neutral voltages may be compared to the nominal service voltage for that service record times the ratio for that voltage, plus or minus a first allowable tolerance range. Measured line to line voltages may be compared to a calculated ideal line to line voltage (e.g., calculated from two measured line to neutral voltages and a fixed value for that line to line voltage from the service record), plus or minus a second allowable tolerance range. Comparisons for each service record may continue until the measured voltages pass the comparisons or until one of the measured values fails a comparison.

At 232, if the measured voltage Van does not fall within the first allowable tolerance range, the method may continue at 254. If the measured voltage Van is within the first allowable tolerance range, the method may continue at 234 where a determination may be made whether the electrical energy meter is a 1-Element meter. If the meter is a 1-Element meter, the method may continue at 280.

If the electrical energy meter is not a 1-Element meter, the method may continue at 236 where a determination may be made whether voltage Vcn (which may be an RMS voltage) is within a first allowable tolerance range. If the measured voltage Vcn does not fall within the first allowable tolerance range, the method may continue at 254. If Vcn is within the first allowable tolerance range, the method may continue at 238 where an ideal line to line voltage between line C and line A, Vcai, may be calculated from Van, Vcn and the phase angle between the two signals. An ideal line to line voltage may be calculated using the law of cosines:

$$c^2 = a^2 + b^2 - 2ab(\cos \phi) \text{ or } c = \sqrt{(a^2 + b^2 - 2ab(\cos \phi))},$$

where $\phi$=the angle between b and a

However, phase angles are not calculated. Instead, since there are a limited number of possible angles for which there are valid service types, the cosine of the angle between the line to line voltages may be stored as a fixed value for the possible service types. For example, as illustrated in the exemplary Tables, the service types may have angle values of 0, 60, 90, 120, 180, 240, 270 or 300 degrees. Therefore the corresponding possible values of the cosine of the angle would be:

Cos(0)=1.0
Cos(60)=Cos(300)=0.5
Cos(90)=Cos(270)=0
Cos(120)=Cos(240)=−0.5
Cos(180)=−1.0

Thus, a value of an ideal line to line voltage for a given service type may be generated without calculating a phase angle by using the fixed values.

As an illustration, consider the example where service record 2 (i.e., row 2) of Table 1 is being processed with a first tolerance range of 25%. Further, the measured value for Van is 125V and the measured value for Vcn is 125V. Since Van and Vcn are within the first tolerance range of their table entry values as described above, the ideal voltage Vcai may be calculated as follows:

$$Vcai = \sqrt{((Vcn)^2 + (Van)^2 - 2(Vcn)(Van)(\cos \phi_{ca}))}$$

$$Vcai = \sqrt{((125)^2 + (125)^2 - 2(125)(125)(-0.5))}$$

$$Vcai = \sqrt{((15625) + (15625) - (-15625))}$$

$$Vcai = 216.506$$

The method may continue at 240 where a determination may be made whether voltage Vca (which may be an RMS voltage) is within a second tolerance range around the calculated ideal voltage Vcai. Adding to the above example, consider that the measured value of Vca is 219V and the second tolerance range is 5%. The ideal voltage Vcai was calculated as 216.506V. The second tolerance range may therefore be calculated as:

Second Tolerance Range: 205.681<Vca<227.331

Thus, in this example, it may be determined that the measured voltage Vca is within the second tolerance range of the calculated ideal voltage Vcai. That is, Vca falls within the value 216.506 Volts, plus or minus the second allowable tolerance range of 5%.

The second tolerance range may be smaller than the first tolerance range used for the line to neutral voltages. By using a smaller tolerance range when comparing a measured line to line voltage to a calculated ideal line to line voltage, a potential to incorrectly match a measured line to line voltage to a table entry may be mitigated as explained further with reference to FIGS. 4 and 5.

With continuing reference to FIG. 2, if the measured voltage Vca does not fall within the second tolerance range of calculated ideal line to line voltage Vcai, the method may continue at 254. If the measured voltage Vca is within the second tolerance range of calculated ideal line to line voltage Vcai, Vca may be deemed to satisfy the table entry corresponding to the fixed value used to calculate the ideal line to line voltage value and may continue at 242. At 242, a determination may be made whether the electrical energy meter is a 2-Element meter. If the meter is a 2-Element meter, the method may continue at 280.

If the electrical energy meter is not a 2-Element meter, the method may continue at 244, where a determination may be made whether voltage Vbn (which may be an RMS voltage) is within a first allowable tolerance range. If the measured voltage Vbn does not fall within the first allowable tolerance range, the method may continue at 254. If the measured voltage Vbn is within the first allowable tolerance range, the method may continue at 246 where an ideal line to line voltage between line A and line B, Vabi, may be calculated. Vabi may be calculated in the same manner as Vcai, except by using Van, Vbn and the fixed value corresponding to Vabi in the current service record.

The method may continue at 248 where a determination may be made whether voltage Vab (which may be an RMS voltage) is within a second allowable tolerance range of Vabi. If the measured voltage Vab does not fall within the second allowable tolerance range, the method may continue at 254. If the measured voltage Vab is within the second allowable tolerance range, the method may continue at 250 where an ideal line to line voltage between line B and line C, Vbci, may be calculated. Vbci may be calculated in the same manner as Vcai, except by using Vbn, Vcn and the fixed value corresponding to Vabi in the current service record.

The method may continue at 252 where a determination may be made whether voltage Vbc (which may be an RMS voltage) is within a second allowable tolerance range of Vbci. If the measured voltage Vbc does not fall within the second allowable tolerance range, the method may continue at 254. If the measured voltage Vbc is within the second allowable tolerance range, the method may continue at 280, where one or more components of the electric service may be identified.

At 280, service information may be obtained, e.g., from one or more of the first three columns of the service record (row) evaluated using the process of FIG. 2 leading to 280. The service information may include the service type (e.g., at 274 of FIG. 3), the special service definition (e.g., at 275 of FIG. 3), and the nominal service voltage (e.g., at 276 of FIG. 3).

Phase voltage magnitudes may vary due to different loading conditions and other factors, but the phase angle between the voltages may remain approximately constant, e.g., since phase voltages may be generated by statically configured rotating machinery. By using a second tolerance with a smaller tolerance range than the first tolerance range, the current method may recognize wide variations in the nominal voltage values, while accurately detecting the appropriate phase angle.

The following examples relating to FIGS. 4 and 5 illustrate possible benefits of using a second tolerance range that is smaller than the first tolerance range (e.g., relating to line to line voltages). As an example relating to FIG. 4, the service type may be a 3WY service being measured with a 2-Element meter. Table 3 may be used as the exemplary service record table. The following may be the exemplary measured voltages relating to the service being measured:

Van=215V
Vcn=240V
Vca=394.24V

In FIG. 4, vertical axis 402 may represent voltage and 410 may represent a measured voltage value for Vca of 394.24V. 420 represents the calculated ideal line to line voltage Vcai, 394.24V, relating to Row 3 of Table 3. The tolerance range defined by 422 and 424 is the tolerance range for Vcai relating to Row 3 of Table 3 using a second tolerance range of 25%. 430 represents the calculated ideal line to line voltage Vcai, 322.22V, relating to Row 8 of Table 3. The tolerance range defined by 432 and 434 is the tolerance range for Vcai relating to Row 8 of Table 3 using the second tolerance range of 25%. 440 represents the calculated ideal line to line voltage Vcai, 445.0V, relating to Row 12 of Table 3. The range defined by 442 and 444 is the tolerance range for Vcai Row 12 of Table 3 using the second tolerance range of 25%.

Continuing the present example and using an exemplary first tolerance range of 25%, the exemplary measured voltages for Van and Vcn satisfy the tolerance ranges for multiple rows (service records) in Table 3. For example, Van and Vcn may satisfy the first tolerance ranges of the following rows from Table 3:

Row 3: 207.8V<Van<346V
207.8V<Vcn<346V
Row 5: 180V<Van<300V
180V<Vcn<300V
Row 8: 180V<Van<300V
155.8V<Vcn<259.8V
Row 12: 180V<Van<300V
180V<Vcn<300V
Row 15: 180V<Van<300V
180V<Vcn<300V
Row 16: 207.8V<Van<346V
207.8V<Vcn<346V

The ideal line to line voltage Vcai may be calculated for each record using the measured value for Van, the measured value for Vcn, and the fixed value for the angle between Vcn and Van from each of the above rows as shown below:

Row 3: $Vcai = \sqrt{((Vcn)^2 + (Van)^2 - 2(Vcn)(Van)(\cos\phi_{ca}))}$ $Vcai = \sqrt{((240)^2 + (215)^2 - 2(240)(215)(-0.5))}$ $Vcai = \sqrt{((57600) + (46225) - (-51600))}$ $Vcai = 394.24V$ Row 5: $Vcai = \sqrt{((Vcn)^2 + (Van)^2 - 2(Vcn)(Van)(\cos\phi_{ca}))}$ $Vcai = \sqrt{((240)^2 + (215)^2 - 2(240)(215)(0.5))}$ $Vcai = \sqrt{((57600) + (46225) - (51600))}$ $Vcai = 228.53V$ Row 8: $Vcai = \sqrt{((Vcn)^2 + (Van)^2 - 2(Vcn)(Van)(\cos\phi_{ca}))}$ $Vcai = \sqrt{((240)^2 + (215)^2 - 2(240)(215)(0))}$ $Vcai = ((57600) + (46225) - (0))$ $Vcai = 322.22V$ Row 12: $Vcai = \sqrt{((Vcn)^2 + (Van)^2 - 2(Vcn)(Van)(\cos\phi_{ca}))}$ $Vcai = \sqrt{((240)^2 + (215)^2 - 2(240)(215)(-1.0))}$ $Vcai = \sqrt{((57600) + (46225) - (-103200))}$ $Vcai = 445V$ Row 15: $Vcai = \sqrt{((Vcn)^2 + (Van)^2 - 2(Vcn)(Van)(\cos\phi_{ca}))}$ $Vcai = \sqrt{((240)^2 + (215)^2 - 2(240)(215)(1.0))}$ $Vcai = \sqrt{((57600) + (46225) - (103200))}$ $Vcai = 25V$ Row 16: $Vcai = \sqrt{((Vcn)^2 + (Van)^2 - 2(Vcn)(Van)(\cos\phi_{ca}))}$ $Vcai = \sqrt{((240)^2 + (215)^2 - 2(240)(215)(1.0))}$ $Vcai = \sqrt{((57600) + (46225) - (103200))}$ $Vcai = 25V$ If the second tolerance range was the same as the first tolerance range, (i.e., 25%), then the following resulting tolerance ranges for Vcai may be calculated:

Row 3: Second Tolerance Range(25%):
295.7<Vca<492.8

Row 5: Second Tolerance Range(25%):
171.4<Vca<285.7

Row 8: Second Tolerance Range(25%):
241.7<Vca<402.8

Row 12: Second Tolerance Range(25%):
333.8<Vca<556.3

Row 15: Second Tolerance Range(25%):
18.8<Vca<31.3

Row 16: Second Tolerance Range(25%):
18.8<Vca<313

That is, using 25% for the second tolerance range results in the measured voltage Vca falling within the second tolerance range of three of the records (Row 3, Row 8 and Row 12). This overlap is illustrated in FIG. 4 as 410 intersects the tolerance ranges of row 3, row 8, and row 12.

The overlap in the tolerance ranges shown in FIG. 4 illustrates a potential problem. Using the current example where the line to line voltage is measured as 394.24V and the 25% tolerance range is used, a unique service record corresponding to the measured line to line voltage may not be found. This is because the measured line to line voltage of 394.24V may match multiple service records when using the 25% tolerance range as described above and illustrated in FIG. 4, that is:

Row 3, which is 277V 3WY,
Row 8, which is 240V 4WD Hi Leg C, and
Row 12 which is 480V, 3W 1P The potential problem illustrated in FIG. 4 may be mitigated by using a smaller second tolerance, e.g., so that the tolerance ranges do not overlap, or, that a measured value is less likely to match multiple tolerance ranges. It may be beneficial to reduce the second tolerance range instead of reducing the first tolerance range. For example, as discussed above in relation to FIG. 2, the calculated ideal line to line voltages may be calculated using measured line to neutral voltages. By using measured line to neutral voltages in the calculations, the calculated ideal line to line voltages may already reflect an anticipated deviation from a nominal state. If the measured line to neutral voltages are higher than the nominal state, it is expected that the line to line voltages may also be higher than the nominal state. And, by using the measured line to neutral voltages, the calculated ideal line to line voltage used for comparison may be higher than the nominal state. Thus, it may be expected that the calculated ideal line to line voltages may be closer to the actual measured line to line voltages than a value anticipated by the nominal state. For exemplary expected nominal state values of line to line voltages, see co-pending U.S. patent application Ser. No. 12/900,651.

Use of a tighter second tolerance range may result in determining a unique service record (a single service record) being identified relating to the measured voltages. Continuing the present example and using a second tolerance range of 5% (instead of 25%), the resulting tolerance ranges may be calculated as:

Row 3: Second Tolerance Range(5%):
374.5<Vca<414.0

Row 5: Second Tolerance Range(5%):
217.1<Vca<240.0

Row 8: Second Tolerance Range(5%):
306.1<Vca<338.3

Row 12: Second Tolerance Range(5%):
422.8<Vca<467.3

Row 15: Second Tolerance Range(5%):
23.8<Vca<26.3

Row 16: Second Tolerance Range(5%):
23.8<Vca<26.3 where the measured line to line voltage of 394.24V matches a single row (Row 3).

FIG. 5 graphically illustrates tolerance ranges for the exemplary calculated ideal line to line voltages of FIG. 4 using the 5% second tolerance range. FIG. 5 includes components of FIG. 4, including vertical axis 402, measured voltage 410, 420 which represents calculated ideal line to line voltage Vcai, 394.24V, relating to Row 3 of Table 3, 430 which represents the calculated ideal line to line voltage Vcai, 322.22V, relating to Row 8 of Table 3, and 440 which represents the calculated ideal line to line voltage Vcai, 445.0V, relating to Row 12 of Table 3. The tolerance range defined by 426 and 428 is the tolerance range for Vcai relating to Row 3 of Table 3 with a second tolerance range of 5%. The tolerance range defined by 436 and 438 is the tolerance range for Vca relating to Row 8 of Table 3 with a second tolerance range of 5%. The tolerance range defined by 446 and 448 is the tolerance range for Vcai relating to Row 12 of Table 3 with a second tolerance range of 5%.

FIG. 5 illustrates that by using the smaller tolerance range (5%), there may be no overlap between the tolerance ranges. By using the smaller second tolerance range, a single service record (as described above and illustrated in FIG. 5) may be identified as satisfying the measured line to line voltage (i.e., Row 3), thereby detecting the appropriate service. That is, a comparison of line to neutral voltages to tabulated ratios/values may result in multiple service records being identified as possible matches (e.g., a measured line to neutral voltage may have been measured at a value that may fall in an area of overlapping tolerance ranges). However, by using a smaller tolerance value when comparing the measured line to line voltage(s) to the calculated ideal line to line voltage(s), the line to line voltage comparison may identify a single service record. If the single service record identified by the line to neutral comparison(s) is one of the multiple records identified by the line to neutral comparison, it may be assumed that the service record identified by the line to neutral comparison(s) is the valid service record. The valid service record may then be used to identify component(s) of the electric service.

What is claimed:

1. A method relating to an energy meter, comprising:
   measuring a line to neutral voltage;
   measuring a line to line voltage;
   calculating an ideal line to line voltage; and
   determining a service type relating to a connection of the energy meter based on the line to neutral voltage, the line to line voltage and the ideal line to line voltage.

2. The method of claim 1, further comprising determining a nominal service voltage relating to the connection of the energy meter based on the line to neutral voltage, the line to line voltage and the ideal line to line voltage.

3. The method of claim 1, wherein the line to neutral voltage, the line to line voltage and the ideal line to line voltage are root-mean-square values.

4. The method of claim 1, wherein determining the service type further comprises storing reference information relating to at least one service type.

5. The method of claim 4, wherein determining the service type further comprises comparing the line to neutral voltage to the reference information and the line to line voltage to the ideal line to line voltage.

6. The method of claim 5, wherein comparing the line to neutral voltage to the reference information further comprises determining that the line to neutral voltage is within a first tolerance range, and wherein comparing the line to line voltage to the ideal line to line voltage further comprises determining that the line to line voltage is within a second tolerance range.

7. The method of claim 6, wherein the second tolerance range is smaller than the first tolerance range.

8. The method of claim 2, wherein determining the nominal service voltage further comprises storing reference information relating to at least one nominal service voltage.

9. The method of claim 8, wherein determining the nominal service voltage further comprises comparing the line to neutral voltage to the reference information and the line to line voltage to the ideal line to line voltage.

10. The method of claim 9, wherein comparing the line to neutral voltage to the reference information further comprises determining that the line to neutral voltage is within a first tolerance range, and wherein comparing the line to line voltage to the ideal line to line voltage further comprises determining that the line to line voltage is within a second tolerance range.

11. The method of claim 10, wherein the second tolerance range is smaller than the first tolerance range.

12. An electrical energy meter comprising:
a digital signal processor configured to:
measure a line to neutral voltage;
measure a line to line voltage; and
calculate an ideal line to line voltage;
a microcontroller configured to:
determine a service type relating to a connection of the energy meter based on the line to neutral voltage, the line to line voltage and the ideal line to line voltage.

13. The electrical energy meter of claim 12, wherein the microcontroller is further configured to determine a nominal service voltage relating to the connection of the electrical energy meter based on the line to neutral voltage, the line to line voltage and the ideal line to line voltage.

14. The electrical energy meter of claim 12, wherein the line to neutral voltage, the line to line voltage and the ideal line to line voltage are root-mean-square values.

15. The electrical energy meter of claim 12, further comprising a memory configured to store reference information relating to at least one service type.

16. The electrical energy meter of claim 15, wherein to determine the service type, the microcontroller is further configured to compare the line to neutral voltage to the reference information and the line to line voltage to the ideal line to line voltage.

17. The electrical energy meter of claim 16, wherein, to compare the line to neutral voltage to the reference information, the microcontroller is further configured to determine that the line to neutral voltage is within a first tolerance range, and to compare the line to line voltage to the ideal line to line voltage, the microcontroller is further configured to determine that the line to line voltage is within a second tolerance range.

18. The electrical energy meter of claim 17, wherein the second tolerance range is smaller than the first tolerance range.

19. The electrical energy meter of claim 13, further comprising a memory configured to store reference information relating to at least one nominal service voltage.

20. The electrical energy meter of claim 19, wherein to determine the nominal service voltage, the microcontroller is further configured to compare the line to neutral voltage to the reference information and the line to line voltage to the ideal line to line voltage.

21. The electrical energy meter of claim 20, wherein, to compare the line to neutral voltage to the reference information, the microcontroller is further configured to determine that the line to neutral voltage is within a first tolerance range, and to compare the line to line voltage to the ideal line to line voltage, the microcontroller is further configured to determine that the line to line voltage is within a second tolerance range.

22. The electrical energy meter of claim 21, wherein the second tolerance range is smaller than the first tolerance range.

* * * * *